United States Patent
Shi

(10) Patent No.: US 11,527,808 B2
(45) Date of Patent: Dec. 13, 2022

(54) WAVEGUIDE LAUNCHER

(71) Applicant: Aptiv Technologies Limited, St. Michael (BB)

(72) Inventor: Shawn Shi, Thousand Oaks, CA (US)

(73) Assignee: Aptiv Technologies Limited, St. Michael (BB)

( * ) Notice: Subject to any disclaimer, the term of this patent is extended or adjusted under 35 U.S.C. 154(b) by 112 days.

(21) Appl. No.: 16/829,409

(22) Filed: Mar. 25, 2020

(65) Prior Publication Data
US 2020/0343612 A1    Oct. 29, 2020

Related U.S. Application Data

(60) Provisional application No. 62/839,904, filed on Apr. 29, 2019.

(51) Int. Cl.
*G01S 7/03* (2006.01)
*H01P 3/12* (2006.01)
(Continued)

(52) U.S. Cl.
CPC ........... *H01P 3/121* (2013.01); *H01Q 1/2283* (2013.01); *H01Q 1/50* (2013.01); *H01Q 7/00* (2013.01); *H01Q 9/045* (2013.01); *H01Q 9/16* (2013.01)

(58) Field of Classification Search
CPC ....... H01P 3/121; H01P 5/107; H01Q 1/2283; H01Q 1/50; H01Q 7/00; H01Q 9/045;
(Continued)

(56) References Cited

U.S. PATENT DOCUMENTS

| 3,462,713 A | 8/1969 | Knerr |
| 3,579,149 A | 5/1971 | Ramsey |

(Continued)

FOREIGN PATENT DOCUMENTS

| CA | 2654470 | 12/2007 |
| CN | 1620738 | 5/2005 |

(Continued)

OTHER PUBLICATIONS

"Extended European Search Report", EP Application No. 18153137.7, dated Jun. 15, 2018, 8 pages.
(Continued)

*Primary Examiner* — Dimary S Lopez Cruz
*Assistant Examiner* — Bamidele A Jegede
(74) *Attorney, Agent, or Firm* — Sawtooth Patent Group PLLC

(57) ABSTRACT

A transceiver includes first electrical channels and second electrical channels. The first electrical channels are configured to transfer electromagnetic signals to first air waveguides. Each of the first electrical channels extend from a transmitter along an exterior surface of a chip package that supports the transmitter and terminate at first transitions on the exterior surface. Each of the first plurality of air waveguides are attached to the exterior surface and overlay one of the first transitions. The transceiver also includes second electrical channels configured to transfer second electromagnetic signals from second air waveguides. Each of the second electrical channels extend from a receiver along the exterior surface of the chip package that supports the receiver and terminate at second transitions on the exterior surface. Each of the second air waveguides are attached to the exterior surface and overlay one of the second transitions.

17 Claims, 4 Drawing Sheets

(51) Int. Cl.
*H01Q 1/22* (2006.01)
*H01Q 1/50* (2006.01)
*H01Q 7/00* (2006.01)
*H01Q 9/04* (2006.01)
*H01Q 9/16* (2006.01)

(58) Field of Classification Search
CPC .... H01Q 9/16; H01Q 1/3233; H01Q 21/0043; H01Q 1/38; H01L 2224/16227; H01L 2223/6627; H01L 23/66; H01L 2224/12105; H01L 2223/6677; G01S 7/032; G01S 7/484
See application file for complete search history.

(56) References Cited

U.S. PATENT DOCUMENTS

| | | | |
|---|---|---|---|
| 4,157,516 A | 6/1979 | Van De Grijp | |
| 4,453,142 A | 6/1984 | Murphy | |
| 4,562,416 A | 12/1985 | Sedivec | |
| 5,432,487 A * | 7/1995 | Dydyk | H01P 1/184 333/161 |
| 5,867,073 A * | 2/1999 | Weinreb | H01P 5/107 333/33 |
| 5,982,256 A | 11/1999 | Uchimura et al. | |
| 5,986,527 A | 11/1999 | Ishikawa et al. | |
| 6,489,855 B1 | 12/2002 | Kitamori et al. | |
| 6,794,950 B2 | 9/2004 | Du Tolt et al. | |
| 6,867,660 B2 | 3/2005 | Kitamori et al. | |
| 6,958,662 B1 | 10/2005 | Salmela et al. | |
| 7,973,616 B2 | 7/2011 | Shijo et al. | |
| 7,994,879 B2 | 8/2011 | Kim et al. | |
| 8,013,694 B2 | 9/2011 | Hiramatsu et al. | |
| 8,089,327 B2 | 1/2012 | Margomenos et al. | |
| 8,159,316 B2 | 4/2012 | Miyazato et al. | |
| 8,692,731 B2 | 4/2014 | Lee et al. | |
| 9,007,269 B2 | 4/2015 | Lee et al. | |
| 9,450,281 B2 | 9/2016 | Kim | |
| 9,673,532 B2 | 6/2017 | Cheng et al. | |
| 9,935,065 B1 * | 4/2018 | Baheti | H01L 23/49822 |
| 10,468,736 B2 | 11/2019 | Mangaiahgari | |
| 10,775,573 B1 | 9/2020 | Hsu et al. | |
| 10,833,385 B2 | 11/2020 | Mangaiahgari et al. | |
| 2002/0021197 A1 | 2/2002 | Elco | |
| 2004/0069984 A1* | 4/2004 | Estes | G02B 6/4201 257/25 |
| 2006/0113598 A1* | 6/2006 | Chen | H01L 23/481 257/347 |
| 2008/0129409 A1 | 6/2008 | Nagaishi et al. | |
| 2008/0150821 A1 | 6/2008 | Koch et al. | |
| 2009/0207090 A1* | 8/2009 | Pettus | H01Q 9/0407 343/873 |
| 2009/0243762 A1 | 10/2009 | Chen et al. | |
| 2010/0182107 A1* | 7/2010 | Margomenos | H01P 3/026 333/246 |
| 2011/0057741 A1* | 3/2011 | Dayan | H01P 5/107 333/26 |
| 2011/0163919 A1* | 7/2011 | Suzuki | H01Q 9/04 361/818 |
| 2012/0013421 A1 | 1/2012 | Hayata | |
| 2012/0050125 A1* | 3/2012 | Leiba | H01Q 1/2283 343/834 |
| 2012/0068316 A1* | 3/2012 | Ligander | H01L 23/49503 257/664 |
| 2012/0163811 A1* | 6/2012 | Doany | G02B 6/43 398/41 |
| 2012/0176285 A1* | 7/2012 | Morgia | H01P 5/107 343/772 |
| 2012/0194303 A1* | 8/2012 | Pettus | H01Q 1/38 29/601 |
| 2012/0242421 A1 | 9/2012 | Robin et al. | |
| 2012/0256796 A1* | 10/2012 | Leiba | H01Q 1/2283 343/702 |
| 2013/0057358 A1* | 3/2013 | Anthony | H01P 5/107 333/26 |
| 2013/0214981 A1* | 8/2013 | Tsutsumi | H01P 1/04 333/260 |
| 2014/0015709 A1 | 1/2014 | Shijo et al. | |
| 2014/0091884 A1 | 4/2014 | Flatters | |
| 2014/0106684 A1 | 4/2014 | Burns et al. | |
| 2015/0097633 A1* | 4/2015 | DeVries | H03H 7/38 333/33 |
| 2015/0229017 A1* | 8/2015 | Suzuki | H01L 23/66 29/601 |
| 2015/0285998 A1* | 10/2015 | Babakhani | H01L 31/18 438/27 |
| 2015/0357698 A1 | 12/2015 | Kushta | |
| 2015/0364804 A1* | 12/2015 | Tong | H01P 5/107 333/135 |
| 2015/0364830 A1* | 12/2015 | Tong | H01Q 23/00 342/27 |
| 2016/0043455 A1* | 2/2016 | Seler | H01P 5/107 29/601 |
| 2016/0049714 A1 | 2/2016 | Ligander et al. | |
| 2016/0118705 A1* | 4/2016 | Tang | H01P 5/107 438/31 |
| 2016/0164189 A1* | 6/2016 | Jafarlou | H01Q 13/02 29/601 |
| 2016/0204495 A1* | 7/2016 | Takeda | H01P 5/087 375/257 |
| 2016/0276727 A1* | 9/2016 | Dang | H01L 25/0655 |
| 2016/0293557 A1* | 10/2016 | Topak | H01P 3/14 |
| 2016/0301125 A1* | 10/2016 | Kim | H01Q 1/2283 |
| 2016/0366770 A1* | 12/2016 | Merkle | H05K 3/465 |
| 2017/0084554 A1* | 3/2017 | Dogiamis | H01L 23/66 |
| 2017/0324135 A1* | 11/2017 | Blech | H01Q 1/38 |
| 2018/0131084 A1* | 5/2018 | Park | H01Q 1/38 |
| 2018/0226709 A1 | 8/2018 | Mangaiahgari | |
| 2018/0233465 A1* | 8/2018 | Spella | H01Q 15/10 |
| 2018/0261924 A1* | 9/2018 | Hill | H01Q 1/48 |
| 2018/0284186 A1* | 10/2018 | Chadha | H01L 23/49816 |
| 2018/0342797 A1* | 11/2018 | Pan | H01Q 21/005 |
| 2018/0343711 A1* | 11/2018 | Wixforth | H01P 5/107 |
| 2018/0351261 A1* | 12/2018 | Kamo | H01P 5/087 |
| 2019/0006743 A1* | 1/2019 | Kirino | H01P 5/12 |
| 2019/0013563 A1* | 1/2019 | Takeda | H01P 5/022 |
| 2019/0089042 A1* | 3/2019 | Purden | H01Q 21/005 |
| 2019/0140344 A1* | 5/2019 | Kirino | H01P 3/123 |
| 2020/0021001 A1 | 1/2020 | Mangaiahgairi | |
| 2020/0235453 A1 | 7/2020 | Lang | |
| 2021/0036393 A1 | 2/2021 | Mangaiahgari | |
| 2021/0356504 A1* | 11/2021 | Bencivenni | G01R 29/10 |

FOREIGN PATENT DOCUMENTS

| | | |
|---|---|---|
| CN | 2796131 | 7/2006 |
| CN | 201383535 | 1/2010 |
| CN | 103515682 | 1/2014 |
| CN | 104900956 | 9/2015 |
| CN | 105609909 | 5/2016 |
| CN | 105680133 | 6/2016 |
| CN | 105958167 | 9/2016 |
| CN | 209389219 | 9/2019 |
| DE | 102019200893 | 7/2020 |
| EP | 2500978 | 9/2012 |
| EP | 2843758 | 3/2015 |
| EP | 3460903 | 3/2019 |
| GB | 2489950 | 10/2012 |
| JP | 2003289201 | 10/2003 |
| KR | 100846872 | 5/2008 |
| WO | 2013189513 | 12/2013 |
| WO | 2018003932 | 1/2018 |

OTHER PUBLICATIONS

"Non-Final Office Action", U.S. Appl. No. 16/583,867, dated Feb. 18, 2020, 8 pages.

"Non-Final Office Action", U.S. Appl. No. 15/427,769, dated Nov. 13, 2018, 8 pages.

(56) References Cited

OTHER PUBLICATIONS

"Notice of Allowance", U.S. Appl. No. 15/427,769, dated Jun. 28, 2019, 9 pages.
"Notice of Allowance", U.S. Appl. No. 16/583,867, dated Jul. 8, 2020, 8 Pages.
Jankovic, et al., "Stepped Bend Substrate Integrated Waveguide to Rectangular Waveguide Transitions", Jun. 2016, 2 pages.
"Foreign Office Action", CN Application No. 201810122408.4, dated Jun. 2, 2021, 15 pages.
"Extended European Search Report", EP Application No. 20166797, dated Sep. 16, 2020, 11 pages.
"Foreign Office Action", CN Application No. 201810122408.4, dated Oct. 18, 2021, 19 pages.
"Non-Final Office Action", U.S. Appl. No. 17/061,675, dated Dec. 20, 2021, 4 pages.
Wang, et al., "Mechanical and Dielectric Strength of Laminated Epoxy Dielectric Graded Materials", Mar. 2020, 15 pages.

\* cited by examiner

WAVEGUIDE LAUNCHER

CROSS-REFERENCE TO RELATED APPLICATION

This application claims the benefit under 35 U.S.C. § 119(e) of U.S. Provisional Patent Application No. 62/839,904, filed Apr. 29, 2019, the entire disclosure of which is hereby incorporated herein by reference in its entirety.

TECHNICAL FIELD OF INVENTION

This disclosure generally relates to a wave guide launcher for millimeter wave radar.

BRIEF DESCRIPTION OF DRAWINGS

The present invention will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
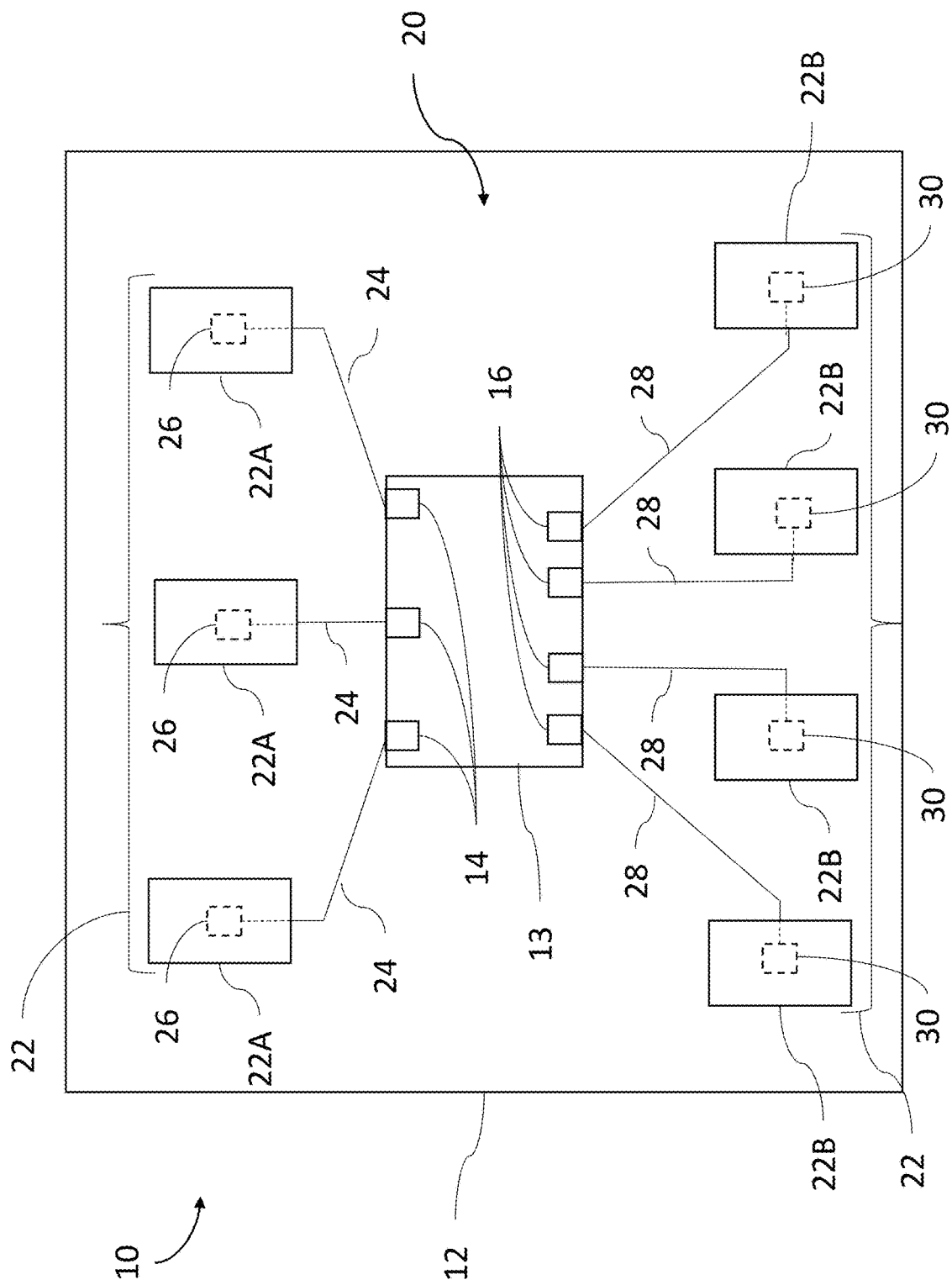
FIG. 1 is an illustration of transceiver in accordance with one embodiment.

FIG. 1 is an illustration of a transceiver 10 configured to transmit and receive electromagnetic signals. In an example, the transceiver 10 transmits and receives the electromagnetic signals in a 76 GHz to 81 GHz frequency band, such as those used in automotive radar systems. The transceiver 10 includes a chip package 12 including a die 13 including at least one transmitter 14 and at least one receiver 16. The at least one transmitter 14 and at least one receiver 16 transmit and receive the electromagnetic signals (i.e., the radar signals) through antennas 18 (see FIG. 4) in communication with the chip package 12. In the example illustrated in FIG. 1, the chip package 12 is a monolithic microwave integrated circuit (MMIC) having a ball grid array (BGA) of interconnects (not shown) on an exterior surface 20. In this example, the chip package 12 supports three transmitters 14 and four receivers 16. It will be appreciated that the chip package 12 may support any number of transmitters 14 and receivers 16 within the dimensional limits of the chip package 12.

Air waveguides 22 are placed between the chip package 12 and the antennas 18 to transport the radar signals being transmitted and received. The air waveguide 22 is a hollow metal structure that is capable of directing electromagnetic power from one area to another area. The transceiver 10 is an improvement over other transceivers, because the transceiver 10 eliminates an intermediate printed circuit board (PCB) that may be placed between chip packages and waveguides to facilitate connections between the devices. The PCB introduces electrical losses that reduce a range of transmission and a range of reception of the radar signals. In addition, inclusion of the PCB results in added material and manufacturing costs.

Referring back to FIG. 1, the transceiver 10 includes a first plurality of electrical channels 24 (i.e., signal transmission lines) configured to transfer first electromagnetic signals to a first plurality of air waveguides 22A. In the example illustrated in FIG. 1, the first electromagnetic signals are the transmitted radar signals, and the air waveguides 22 are WR10 air waveguides 22. WR10 designates that the waveguide is rectangular, with the dimensions of 2.54 mm by 1.27 mm. Slight variations of these dimensions does not significantly deteriorate the performance of the waveguide, and the rectangular shape need not be a "perfect" rectangle. The dimensions of the air waveguide 22 establish a limit on a frequency of the electromagnetic signal that may be passed through the air waveguide 22. The air waveguides 22 may be formed with a tortuous path (i.e., bends) to direct the radar signals to and from the antennas 18 that may be arranged in an antenna array.

Each of the first plurality of electrical channels 24 extend from outputs of at least one transmitter 14 along the exterior surface 20 of the chip package 12. That is, the first plurality of electrical channels 24 run along an outside of the chip package 12 and are exposed to the environment (e.g., air). In some configurations, this exposure results in about half of the guiding power propagating into the exterior surface 20, and about half of the guiding power propagating in the air. Because air has nearly no loss, this configuration ensures low transmission line losses.

The first plurality of electrical channels 24 terminate at first transitions 26 disposed on the exterior surface 20. The first transitions 26 are a link between the transmission lines and the air waveguides 22, and will be described in more detail below. Each of the first plurality of air waveguides 22A are attached to the exterior surface 20 of the chip package 12 and overlay one of the first transitions 26. In an example, the first plurality of air waveguides 22A are integrated into a waveguide antenna assembly that is attached to the exterior surface 20 of the chip package 12. In this example, ends of the first plurality of air waveguides 22A are arranged within a surface of the waveguide antenna assembly to overlay the first transitions 26. The ends of the first plurality of air waveguides 22A that overlay the first transitions 26 may be open, or may be partially closed (e.g., slotted), as will be described in more detail below.

The transceiver 10 also includes a second plurality of electrical channels 28 configured to transfer second electromagnetic signals from a second plurality of air waveguides 22B. In the example illustrated in FIG. 1, the second electromagnetic signals are the received radar signals (i.e. the radar signals reflected from a target), and the air waveguides 22 are the WR10 air waveguides 22. Each of the second plurality of electrical channels 28 extend from an input of at least one receiver 16 along the exterior surface 20 of the chip package 12. The second plurality of electrical channels 28 terminate at second transitions 30 disposed on the exterior surface 20. Each of the second plurality of air waveguides 22B are attached to the exterior surface 20 and overlay one of the second transitions 30. In an example, the second plurality of air waveguides 22B are integrated into the waveguide antenna assembly that is attached to the exterior surface 20 of the chip package 12. In this example, ends of the second plurality of air waveguides 22B are arranged within the surface of the waveguide antenna assembly to overlay the second transitions 30. The ends of the second plurality of air waveguides 22B that overlay the second transitions 30 may be open, or may be partially closed (e.g., slotted), as will be described in more detail below.

Figure 2C:
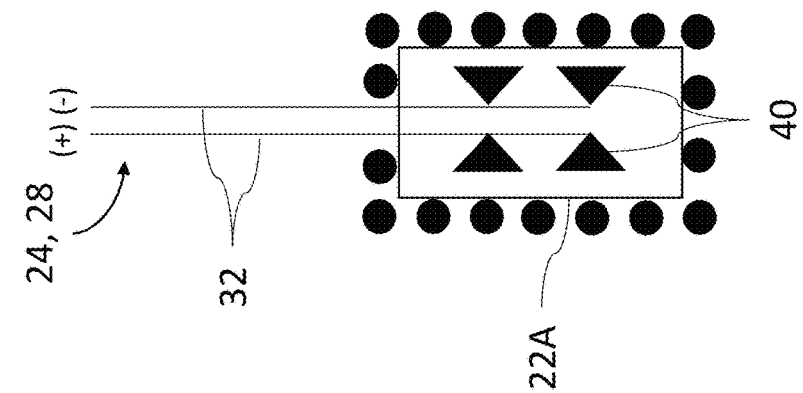
FIG. 2C is an illustration of electrical channels and transitions in accordance with yet another embodiment.
Figure 2B:
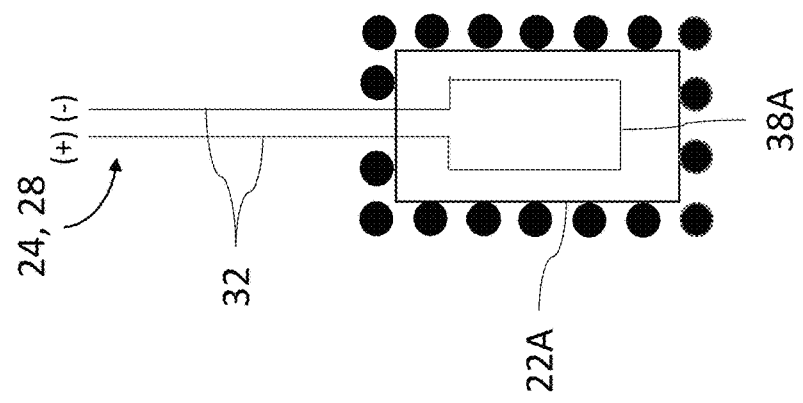
FIG. 2B is an illustration of electrical channels and transitions in accordance with another embodiment.
Figure 2A:
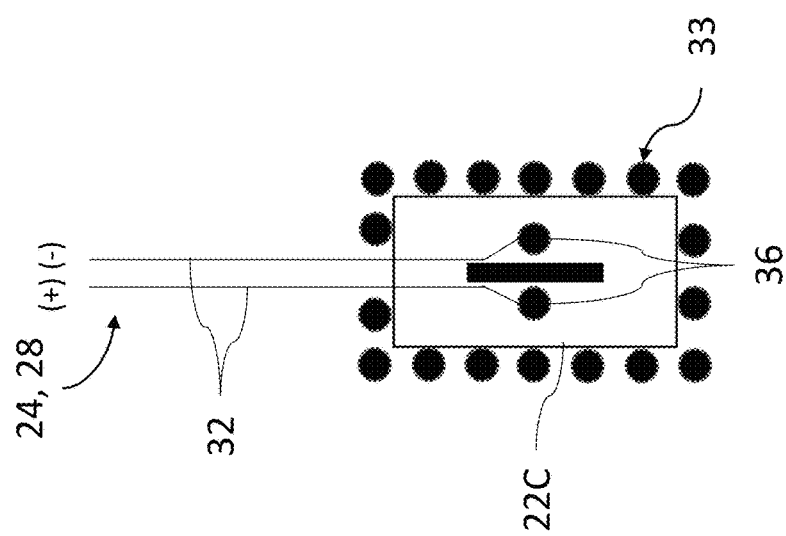
FIG. 2A is an illustration of electrical channels and transitions in accordance with one embodiment.

FIGS. 2A-2C illustrate examples of the first plurality of electrical channels 24 and/or the second plurality of electrical channels 28 that include differential pairs of microstrips 32. The differential pair of microstrips 32 are formed of two, parallel metallic strips having a constant spacing along their length. One of the metallic strips is connected to a positive terminal of the respective transceiver 10 channel, and the other metallic strip is connected to a negative terminal of the respective transceiver 10 channel. The microstrips 32 are formed of metals, such as copper, aluminum, silver, gold, and alloys thereof, and may be formed on the exterior surface 20 by any of the known methods of deposition, such as physical vapor deposition. The microstrips 32 may be separated using techniques such as photolithography and/or micromachining. In the examples illustrates in FIGS. 2A-2C, the differential pairs of microstrips 32 terminate in a region of the exterior surface 20 of the chip package 12 that is surrounded by a solder ball fence 33. One end of the solder ball fence 33 defines a gap (i.e., a "mouse hole") through which the differential pairs of microstrips 32 pass. The solder ball fence 33 provides electromagnetic shielding for the air waveguides 22.

Figure 3C:
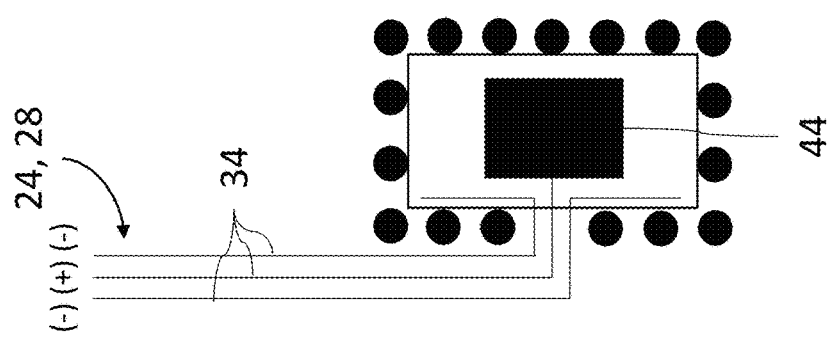
FIG. 3C is an illustration of electrical channels and transitions in accordance with yet another embodiment.
Figure 3B:
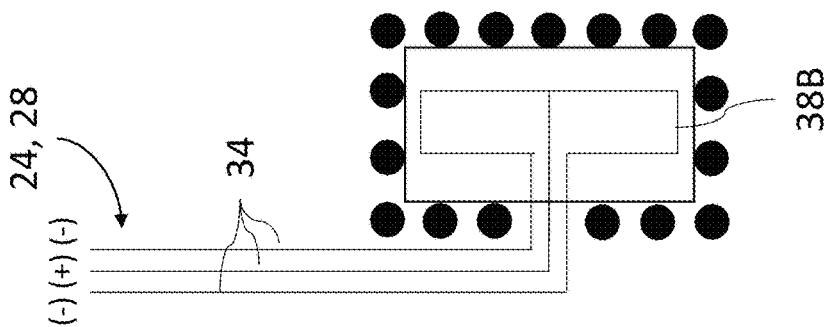
FIG. 3B is an illustration of electrical channels and transitions in accordance with yet another embodiment.
Figure 3A:
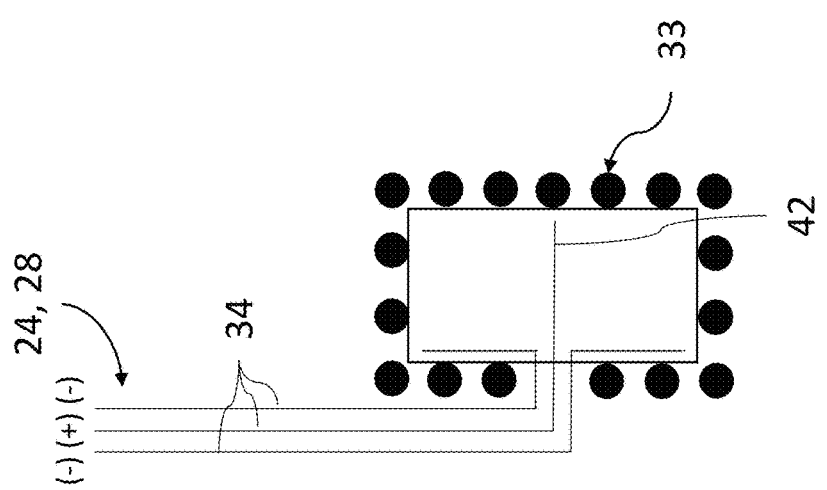
FIG. 3A is an illustration of electrical channels and transitions in accordance with yet another embodiment.

FIGS. 3A-3C illustrate examples of the first plurality of electrical channels 24 and the second plurality of electrical channels 28 that include co-planar waveguides 34. The co-planar waveguides 34 are formed of three, parallel, metallic strips having a constant spacing along their length. A center metallic strip is connected with a positive terminal of the respective transceiver 10 channel, and the other two metallic strips are attached to a negative terminal of the respective transceiver 10 channel. The co-planar waveguides 34 are formed of metals, such as copper, aluminum, silver, gold, and alloys thereof, and may be applied to the exterior surface 20 by any of the known methods of deposition, such as physical vapor deposition. The co-planar waveguides 34 may be separated using techniques such as photolithography and/or micromachining. In the examples illustrates in FIGS. 3A-3C, the co-planar waveguides 34 also terminate in a region of the exterior surface 20 of the chip package 12 that is surrounded by the solder ball fence 33. One side of the solder ball fence 33 defines the gap through which the co-planar waveguides 34 pass. The co-planar waveguides 34 are arranged so that a 90-degree turn is made before passing through the gap, which assists in the conversion of the electromagnetic signals from the co-planar waveguides 34 to the air waveguides 22. That is, the 90-degree bend aligns a polarization of the co-planar waveguide 34 with the air waveguide 22 for maximum transition efficiency.

In an example, the first plurality of electrical channels 24 and the second plurality of electrical channels 28 are of the same design (i.e., all differential pairs of microstrips 32 or all co-planar waveguides 34). In another example, the first plurality of electrical channels 24 and the second plurality of electrical channels 28 are of different designs. In an example, the first plurality of electrical channels 24 and the second plurality of electrical channels 28 terminate at first transitions 26 and second transitions 30 that are of the same design. In another example, the first plurality of electrical channels 24 and the second plurality of electrical channels 28 terminate at first transitions 26 and second transitions 30 that are of a different design. The following descriptions of the first plurality of electrical channels 28, the first transitions 26, and the first plurality of air waveguides 22A will also apply to the second plurality of electrical channels 28, the second transitions 30, and the second plurality of air waveguides 22B.

FIG. 2A illustrates the differential pairs of microstrips 32 that terminate at the first transitions 26 which include a pair of opposed solder ball transitions 36. The pair of opposed solder ball transitions 36 may be formed of any solder alloy compatible with the chip package 12, such as alloys of silver and/or alloys of gold. In this example, the first plurality of air waveguides 22A include slotted air waveguides 22C where the slot is positioned between the pair of opposed solder ball transitions 36. In this example, the end of the slotted air waveguide 22C that overlays the pair of opposed solder ball transitions 36 is closed except for the slot. The pair of opposed solder ball transitions 36 are in electrical contact with the slotted end of the slotted air waveguide 22C. The slot is an opening in the end of the slotted air waveguide 22C and disrupts the electric and magnetic fields established between the solder balls. This disruption in the fields enables the radar signal to propagate along a particular axis through the slotted air waveguides 22C.

FIG. 2B illustrates the differential pairs of microstrips 32 that terminate at the first transitions 26 which include loop transitions 38A. In this example, the loop transition 38A is continuous rectangular metallic loop that connects the differential pairs of microstrips 32. The loop transition 38A may be formed of metals, such as copper, aluminum, silver, gold, and alloys thereof. In this example, the end of the air waveguide 22A that overlays the loop transition 38A is open. The loop transition 38A has a perimeter equal to about one wavelength of the radar signal. The magnetic field surrounding the loop transition 38A, created by the electrical current flow through the loop, generates the electromagnetic signal that is transported through the air waveguide 22A.

FIG. 2C illustrates the differential pairs of microstrips 32 that terminate at the first transitions 26 which include bowtie transitions 40. The bowtie transitions 40 may be formed of metals, such as copper, aluminum, silver, gold, and alloys thereof. In this example, the bowtie transitions 40 are triangular metal pads that are in contact with the differential pairs of microstrips 32. In this example, the end of the air waveguide 22A that overlays the bowtie transition 40 is open. An angle between the opposing triangular metal pads of the bowtie transitions 40 specifies the frequency bandwidth of this first transition 26, as opposed to a perimeter dimension. The bowtie transition 40 is capable of operating in a wider range of frequencies, compared to the loop transition 38A.

FIG. 3A illustrates the co-planar waveguides 34 that terminate at the first transitions 26 which include monopole transitions 42. The monopole transitions 42 are formed by extensions of the co-planar waveguides 34 into the region overlaid by the end of the air waveguide 22. The monopole transitions 42 may be formed of metals, such as copper, aluminum, silver, gold, and alloys thereof. In this example, the end of the air waveguide 22A that overlays the monopole transitions 42 is open. In this example, the length of the positive strip (i.e. the monopole) that extends into the region overlaid by the air waveguide 22 is equal to about one quarter of the wavelength of the radar signal. The two negative strips on either side of the monopole form a ground plane. The magnetic field surrounding the monopole transitions 42, created by a voltage potential between the monopole and the ground plane, generates the electromagnetic signal that is transported through the air waveguide 22A.

FIG. 3B illustrates the co-planar waveguides 34 that terminate at the first transitions 26 which include loop transitions 38B. In this example, the loop transition 38B includes a continuous rectangular metallic loop that connects the two negative strips of the co-planar waveguide 34, and is bifurcated by the positive strip of the co-planar waveguides 34, creating two loops with equal perimeters. The loop transition 38B may be formed of metals, such as copper, aluminum, silver, gold, and alloys thereof. In this example, the end of the air waveguide 22A that overlays the loop transition 38B is open. Each of the two loops in the loop transition 38B has a perimeter of about one half of a wavelength of the radar signal. The magnetic field surrounding the loop transition 38B, created by the electrical current flow through the two loops, generates the electromagnetic signal that is transported through the air waveguide 22A.

FIG. 3C illustrates the co-planar waveguides 34 that terminate at the first transitions 26 which include patch transitions 44. The patch transitions 44 may be formed of metals, such as copper, aluminum, silver, gold, and alloys thereof. In this example, the end of the air waveguide 22A that overlays the patch transitions 44 is open. In this example, the patch transitions 44 are rectangular metal pads that are in contact with the positive strip of the co-planar waveguides 34. The two negative strips form the ground plane. A length of the patch transitions 44 is about one half of a wave length, and the patch transitions 44 radiate the electromagnetic energy into the air waveguide 22 similar to an antenna 18. The magnetic field surrounding the patch transitions 44, created by the voltage potential between the patch and the ground plane, generates the electromagnetic signal that is transported through the air waveguide 22A.

Figure 4:
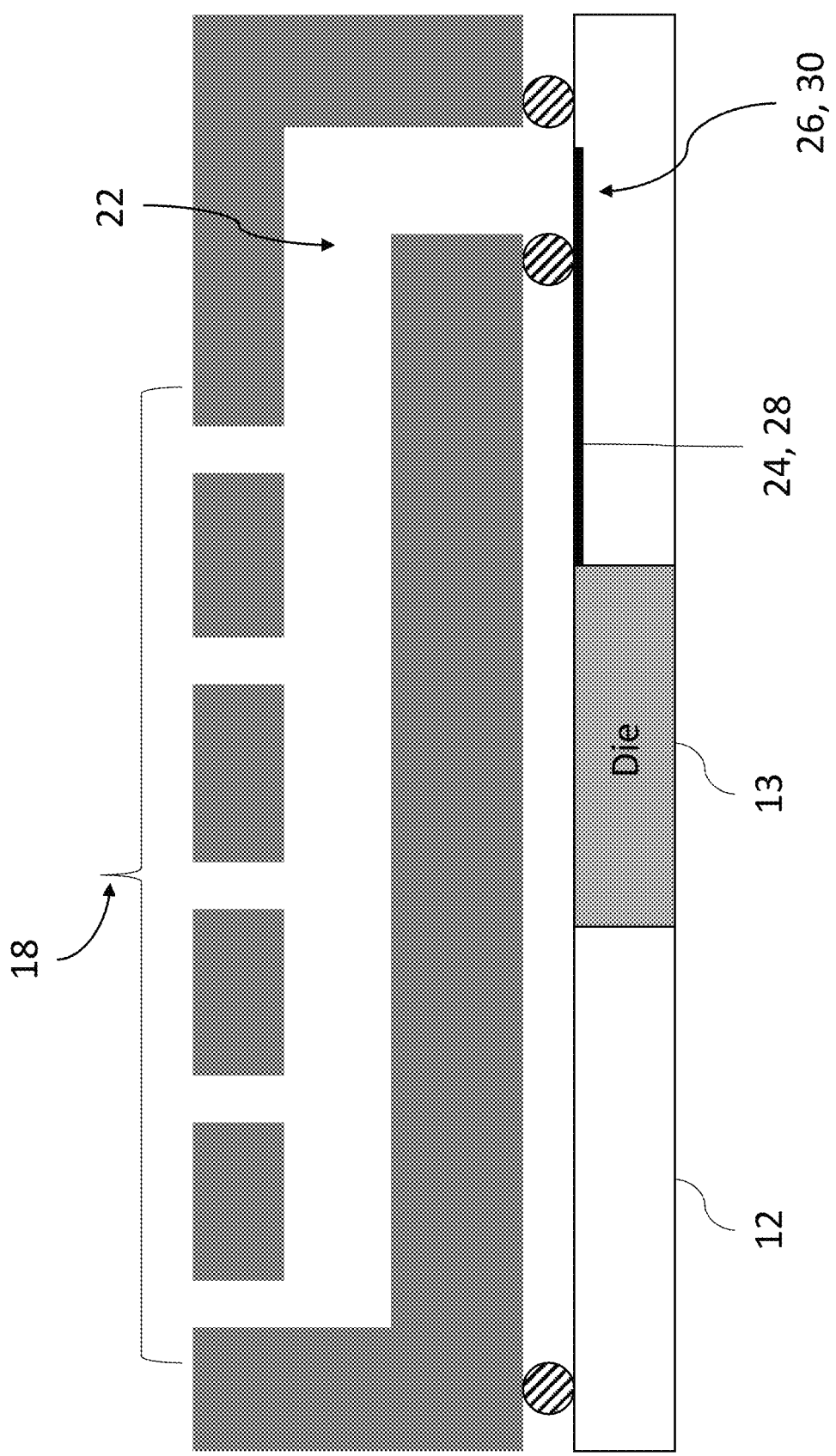
FIG. 4 is a cross section of the transceiver of FIG. 1 in accordance with one embodiment.

FIG. 4 is a cross section view of the transceiver 10, illustrating an example of the antenna assembly that is attached to the exterior surface 20 of the chip package 12. In this example, the air waveguide 22 is integrated into the antenna assembly and directs the radar signals between the first transition 26 and the antennas 18. In this example, the antennas 18 are multiple slots that radiate and/or collect the radar signals. In this example, the antenna assembly is attached to the chip package 12 using solder balls from the BGA.

While this invention has been described in terms of the preferred embodiments thereof, it is not intended to be so limited, but rather only to the extent set forth in the claims that follow. "One or more" includes a function being performed by one element, a function being performed by more than one element, e.g., in a distributed fashion, several functions being performed by one element, several functions being performed by several elements, or any combination of the above. It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact. The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context. Directional terms such as top, bottom, upper, lower, left, right, front, rear, etc. do not denote any particular orientation, but rather these directional terms are used to distinguish one element from another and establish a relationship between the various elements.

I claim:

1. A transceiver, comprising:
a plurality of electrical channels configured to transfer electromagnetic signals to a plurality of air waveguides, the plurality of electrical channels each comprising a differential pair of microstrips having first and second microstrips, the first microstrip connected to a positive terminal of a respective transceiver channel and the second microstrip connected to a negative terminal of the respective transceiver channel, the plurality of electrical channels comprising an electrical channel that terminates at a transition that provides a link between the electrical channel and an air waveguide that overlays the transition, the transition comprising a region of an exterior surface of a chip package, the chip package configured to support at least one transmitter or at least one receiver, the region being overlaid by an end of the air waveguide, the region surrounded by a solder ball fence configured to provide electromagnetic shielding for the air waveguide, the solder ball fence defining a gap through which the differential pair of microstrips pass, the transition including an arrangement selected from the group consisting of:
a pair of opposed solder ball transitions that are in electrical contact with the end of the waveguide on opposing sides of a slot, the end of the air waveguide that overlays the region including the slot, the slot being positioned between the pair of opposed solder ball transitions; and
at least one bowtie transition comprising opposing triangular metal pads that are in contact with the differential pairs of microstrips, the end of the air waveguide that overlays the region being open.

2. The transceiver of claim 1, wherein:

the slot is configured to disrupt magnetic fields established between the opposed solder ball transitions and enable a radar signal to propagate through the air waveguide.

3. The transceiver of claim 1, wherein the at least one bowtie transition includes:
   a first triangular metal pad in contact with the first microstrip; and
   a second triangular metal pad in contact with the second microstrip and positioned opposite the first triangular metal pad.

4. The transceiver of claim 3, wherein an angle formed between the opposing triangular metal pads specifies a frequency bandwidth of the transition.

5. The transceiver of claim 1, wherein:
   the opposed solder ball transitions include first and second solder balls;
   the first microstrip terminates at the first solder ball; and
   the second microstrip terminates at the second solder ball.

6. A transceiver comprising:
   a plurality of electrical channels configured to transfer electromagnetic signals to a plurality of air waveguides, the plurality of electrical channels each comprising co-planar waveguides formed of three parallel metallic strips, the three parallel metallic strips having a center strip and two outer strips, the center strip connected to a positive terminal of a respective transceiver channel, the two outer strips each connected to a negative terminal of the respective transceiver channel, the co-planar waveguides configured to terminate at a transition within a region of an exterior surface of a chip package, the chip package configured to support at least one transmitter or at least one receiver, the region being overlaid by an end of the air waveguide and surrounded by a solder ball fence configured to provide electromagnetic shielding for the air waveguide, the solder ball fence defining a gap through which the co-planar waveguides pass, the co-planar waveguides being arranged with a 90-degree turn before passing through the gap and into the region, the 90-degree turn in the co-planar waveguides assisting in a conversion of electromagnetic signals from the co-planar waveguides to the air waveguide by aligning a polarization of the co-planar waveguides with the air waveguide.

7. The transceiver of claim 6, wherein:
   the transition includes a monopole transition formed by extensions of the co-planar waveguides into the region overlaid by the end of the air waveguide; and
   the end of the waveguide that overlays the region is open.

8. The transceiver of claim 7, wherein:
   the center strip includes a length extending into the region overlaid by the air waveguide; and
   the length is equal to about one quarter of a wavelength of a radar signal transmitted by the at least one transmitter or received by the at least one receiver.

9. The transceiver of claim 8, wherein the monopole transition is formed of at least one of copper, aluminum, silver, gold, or a metallic alloy.

10. The transceiver of claim 8, wherein the two outer strips are configured to form a ground plane.

11. The transceiver of claim 6, wherein:
    the transition includes a loop transition formed by a continuous rectangular metallic loop that connects the two outer strips of the co-planar waveguides and is bifurcated by the center strip of the co-planar waveguides to create two loops with equal perimeters; and
    the end of the waveguide that overlays the region is open.

12. The transceiver of claim 11, wherein each of the two loops having a perimeter of about one half of a wavelength of a radar signal transmitted by the at least one transmitter or received by the at least one receiver.

13. The transceiver of claim 12, wherein the loop transition is formed of at least one of copper, aluminum, silver, gold, or a metallic alloy.

14. The transceiver of claim 6, wherein:
    the transition includes a patch transition comprising a metal pad that is in contact with the center strip of the co-planar waveguides; and
    the two outer strips form a ground plane.

15. The transceiver of claim 14, wherein a length of the patch transition is about one half of a wavelength of a radar signal transmitted by the at least one transmitter or received by the at least one receiver.

16. The transceiver of claim 15, wherein the patch transition is formed of at least one of copper, aluminum, silver, gold, or a metallic alloy.

17. The transceiver of claim 15, wherein the two outer strips are configured to form a ground plane.

* * * * *